United States Patent [19]
Terada et al.

[11] Patent Number: 5,475,876
[45] Date of Patent: Dec. 12, 1995

[54] TUNER UNIT HAVING ELECTROMAGNETICALLY ISOLATED UHF AND VHF SECTION WITH NO NOISE

[75] Inventors: Yoshiharu Terada; Isao Horie, both of Shiga, Japan

[73] Assignee: NEC Corporation, Tokyo, Japan

[21] Appl. No.: 206,820

[22] Filed: Mar. 7, 1994

[30] Foreign Application Priority Data

Mar. 8, 1993 [JP] Japan .................................. 5-045611

[51] Int. Cl.⁶ ............................. H04B 1/12; H04B 15/06
[52] U.S. Cl. ..................... 455/301; 455/188.2; 455/317; 361/816
[58] Field of Search .................................. 455/300, 301, 455/180.1, 180.2, 188.1, 188.2, 317; 361/816, 818

[56] References Cited

U.S. PATENT DOCUMENTS

| | | |
|---|---|---|
| 3,723,882 | 3/1973 | Carlson ................................. 455/301 |
| 4,689,825 | 8/1987 | Geiger et al. . |
| 4,691,378 | 9/1987 | Kumamoto et al. .................... 455/301 |

Primary Examiner—Chi H. Pham
Attorney, Agent, or Firm—Whitham, Curtis, Whitham & McGinn

[57] ABSTRACT

In a tuner unit including an antenna input filter section, a UHF section, a VHF section, and a PLL section which are electromagnetically separated by walls, an inductor for a VHF local oscillator is disposed adjacent to the UHF section, and is electromagnetically separated by a subdivision wall from the UHF section and the VHF section.

22 Claims, 5 Drawing Sheets

TUNER UNIT HAVING ELECTROMAGNETICALLY ISOLATED UHF AND VHF SECTION WITH NO NOISE

BACKGROUND OF THE INVENTION

1. Field of the Invention

The present invention relates to a television receiver, and more particularly, to a tuner unit having a UHF section and a VHF section controlled by a phase-locked loop section, for example.

2. Description of the Related Art

A prior art tuner unit includes an antenna input filter section, a UHF section and a VHF section both of which are connected to the antenna input filter section, and a control section such as a phase-locked loop (PLL) section. The UHF section includes a high frequency amplifier as a preamplifier stage, a local oscillator, and a mixer for mixing an output of the high frequency amplifier with an output of the local oscillator, to thereby generate an intermediate frequency (IF) signal. Similarly, the VHF section includes a high frequency amplifier as a preamplifier stage, a local oscillator, and a mixer for mixing an output of the high frequency amplifier with an output of the local oscillator, to thereby generate an IF signal. The frequencies of the two local oscillators are controlled by the PLL section.

The antenna input filter section, the UHF section, the VHF section and the PLL section are conventionally mounted on a single printed circuit board, and each of the sections is electromagnetically separated from each other by electromagnetic shields (hereinafter referred to as "walls"). This will be explained in detail later.

In the prior art tuner unit, however, an inductor for the VHF local oscillator is easily vibrated to fluctuate the frequency of the VHF local oscillator, thus generating noise in a television reception image. Also, in the VHF section, since the inductor for the VHF local oscillator and a load inductor for the mixer are located in the same section, the output signal of the VHF local oscillator is leaked to a post stage such as an IF amplifier and to the exterior. Further, particularly in the UHF section, since the distance between the local oscillator and the mixer is large enough to increase the stray capacity of the local oscillator, the operation of the local oscillator in a high frequency region is unstable at a high temperature. Still further, each of the oscillators is located in proximity to an integrated circuit of the PLL section so as to reduce the interference of spurious signals generated from the oscillators, thus improving the characteristic of the tuner unit. In this case, however, the integrated circuit for the PLL section is so distant from a data input portion for the PLL section that digital signals applied to the data input portion affect the operation of the tuner unit and the IF amplifier.

SUMMARY OF THE INVENTION

It is an object of the present invention to provide a tuner unit which generates almost no noise in a television reception image.

Another object of the present invention is to provide a tuner unit which can reduce the leakage of the output signals of the local oscillators to a post stage such as an IF amplifier.

A further object is to stabilize the operation of a local oscillator, particularly, of the UHF section in a high frequency region.

A still further object of the present invention is to reduce the effect of digital signals applied to a data input portion of a control section such as a PLL section on the operation of the tuner unit and the like.

According to the present invention, in a tuner unit including an antenna input filter section, a UHF section, a VHF section, and a PLL section which are electromagnetically separated by walls, an inductor for a VHF local oscillator is disposed adjacent to the UHF section, and is electromagnetically separated by a subdivision wall from the VHF section. Thus, since the inductor for the VHF local oscillator is resistant to vibration, noise is hardly generated in a television reception image. Also, since the inductor for the VHF section can be electromagnetically separated from a load inductor of the mixers, the leakage of the output signals of the local oscillators can be reduced.

Also, in the present invention, a UHF mixer/local oscillator and a VHF mixer/local oscillator except for inductors are formed by an integrated circuit which is located approximately near the inductors, to thereby reduce the stray capacity, and thus stabilize the operation of the local oscillators.

Further, in the present invention, the control section such as the PLL section is located in proximity to the local oscillators, to reduce the interaction of spurious signals generated therefrom, and simultaneously, the data input portion for the control section can be located in proximity to the control section, to reduce the effect of the digital signals applied to the data input portion on the tuner unit and the IF amplifier.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art tuner units will be explained with reference to FIGS. 1, 2 and 3.

Figure 1:
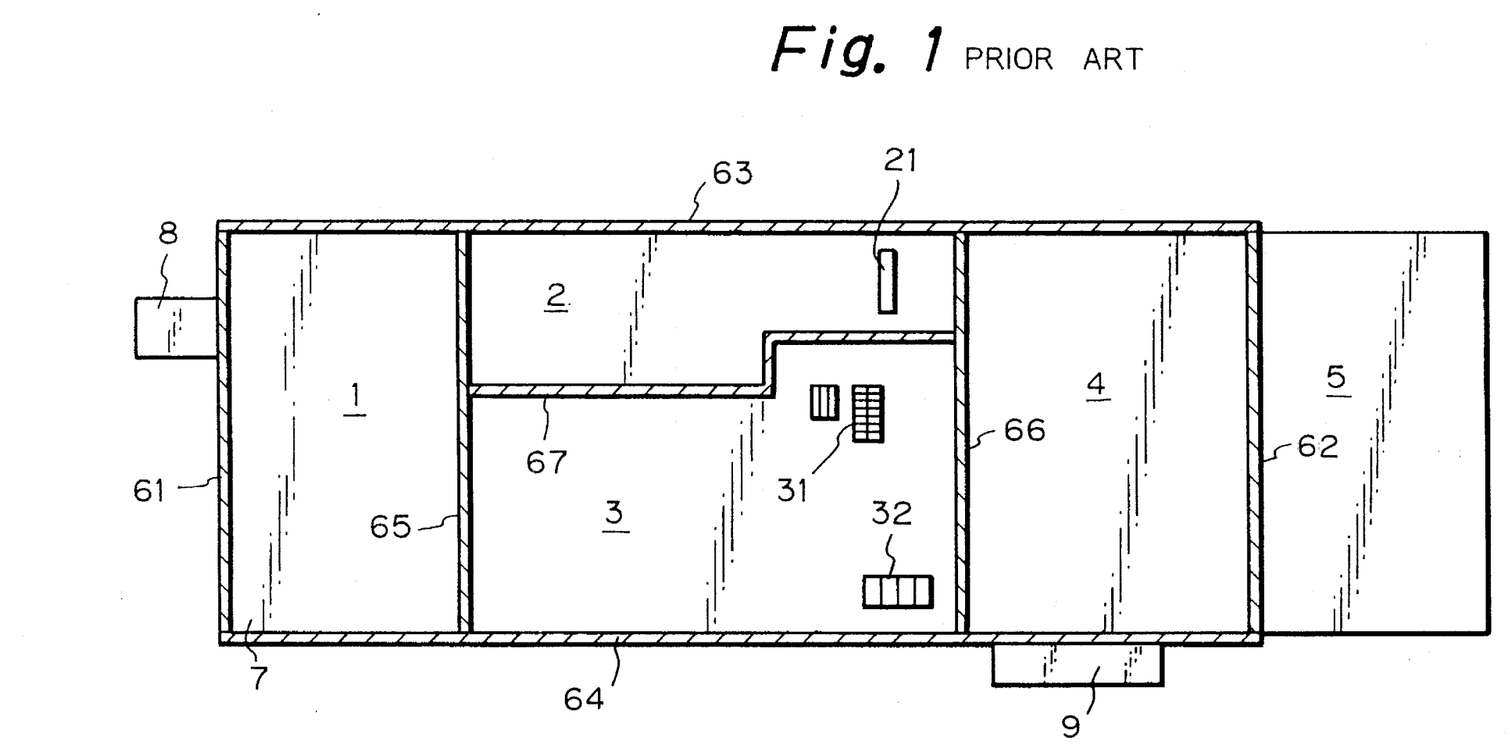
FIGS. 1, 2 and 3 are plan views illustrating prior art tuner units.

In FIG. 1, which illustrates a first prior art tuner unit incorporating an IF amplifier, this tuner unit is formed by an antenna input filter section 1 which is followed by a UHF section 2 and a VHF section 3. Local oscillators of the UHF section 2 and the VHF section 3 are controlled by a PLL section 4. The output signals of the UHF section 2 and the VHF section 3 are fed to an IF section 5 which also includes a demodulator for a video signal.

Each of the sections 1, 2, 3 and 4 is electromagnetically separated from each other by walls (electromagnetic shields). That is, reference numerals 61 and 62 designate end walls approximately parallel to each other, and reference numerals 63 and 64 designate side walls approximately parallel to each other between the end walls 61 and 62. Also, reference numerals 65 and 66 designate separating walls approximately parallel to the end walls 61 and 62 therebetween, and the separating walls 65 and 66 are located between the side walls. Further, reference numeral 67 designates a stepped separating wall between the separating walls 65 and 66. The walls 61 through 67 are mounted on a printed circuit board 7.

The antenna input filter section 1 is defined by the end wall 61, the side walls 63 and 64, and the separating wall 65. The antenna input filter section 1 filters a received signal at a UHF/VHF common input terminal 9, and transmits it to the UHF section 2 and the VHF section 3.

The UHF section 2 is defined by the side wall 63 and the separating walls 65, 66 and 67. The UHF section 2 includes a local oscillation inductor 21. Note that the UHF section 2 also includes a high frequency amplifier, a local oscillator having the local oscillation inductor 21, and a mixer for mixing the output of the high frequency amplifier with the output of the local oscillator, which are not shown.

The VHF section 3 is defined by the side wall 64 and the separating walls 65, 66 and 67. The VHF section 3 includes a local oscillation inductor 31 and a load inductor 32. Note that the VHF section 3 also includes a high frequency amplifier, a local oscillator having the local oscillation inductor 31, and a mixer including the load inductor 32 for mixing the output of the high frequency amplifier with the output of the local oscillator, which are not shown.

The PLL section 4 is defined by the end wall 62, the side walls 63 and 64, and the separating wall 66. The PLL section 4 controls the local oscillators of the UHF section 2 and the VHF section 3 in accordance with control signals applied to a data input portion 9.

Figure 2:
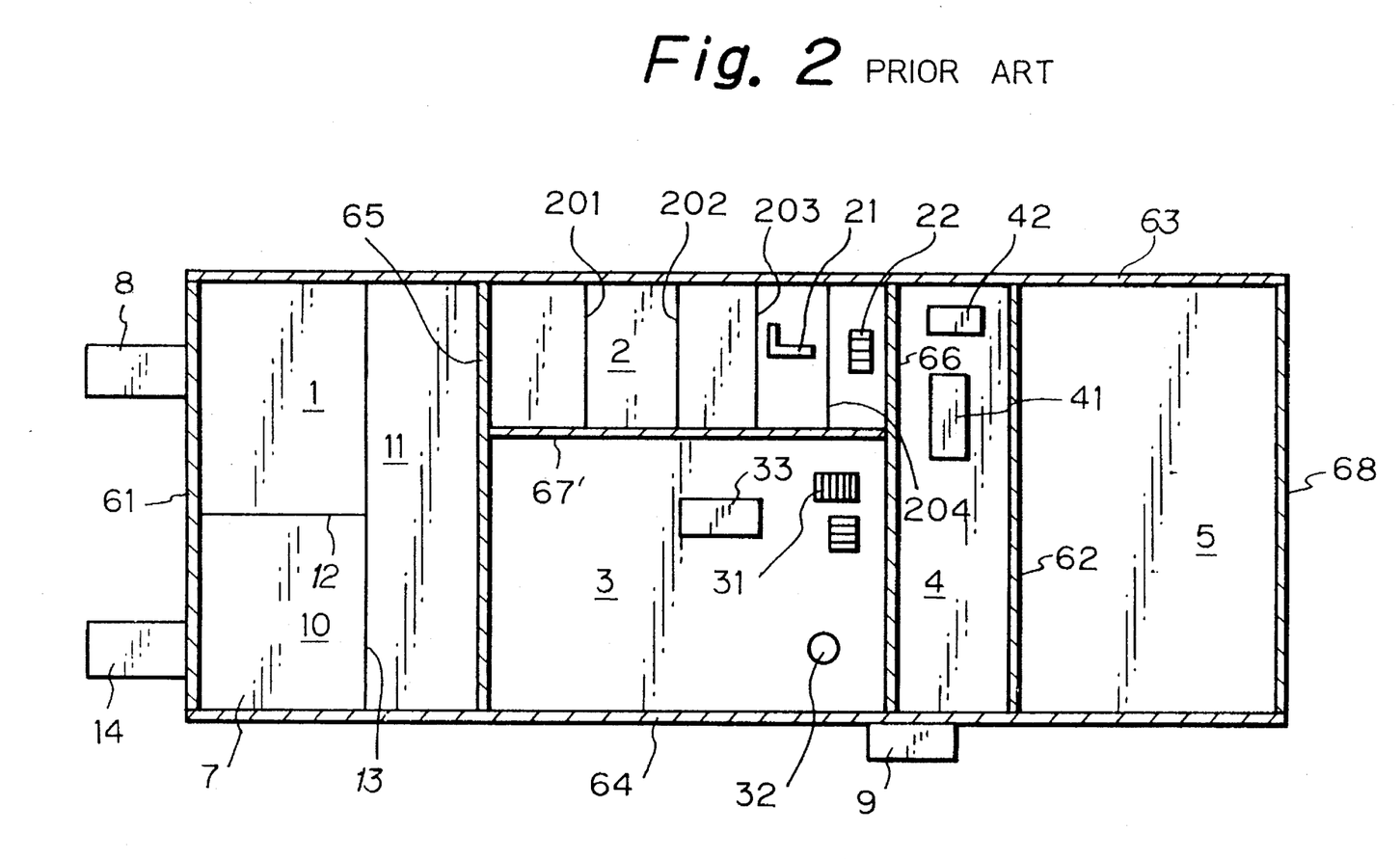

In FIG. 2, which illustrates a second prior art tuner unit, a RF modulator section 10 and a switch section 11 are added to the tuner unit of FIG. 1. The antenna input filter section 1, the RF modulator section 10 and the switch section 11 are electromagnetically separated by subdivision walls 12 and 13. The RF modulator section 10 receives an audio/video signal and converts it into a carrier wave signal which is output to a TV signal output terminal 14 mounted on the end wall 61. The switch section 11 selects one of the antenna input filter section 1 and the RF modulator section 10.

Also, in FIG. 2, the UHF section 2 is defined by a straight separating wall 67' instead of the stepped separating wall 67 of FIG. 1. In the UHF section 2, reference numeral 22 designates a load inductor which transmits an output of the local oscillator (not shown) to the PLL section 4. Also, the UHF section 2 is divided into a plurality of areas by subdivision walls 201 through 204.

In the VHF section 3, an integrated circuit 33 for the mixer and the local oscillator except for the local oscillation inductor 31 is also illustrated.

In the PLL section 4, a PLL integrated circuit 41 and a reference oscillator 42 are illustrated.

In FIG. 2, the side walls 63 and 64 are extended, and an end wall 68 is added to the ends of the side walls 63 and 64. Thus, the IF section 5 is defined by the side walls 63 and 64, and the end walls 62 and 68.

Figure 3:
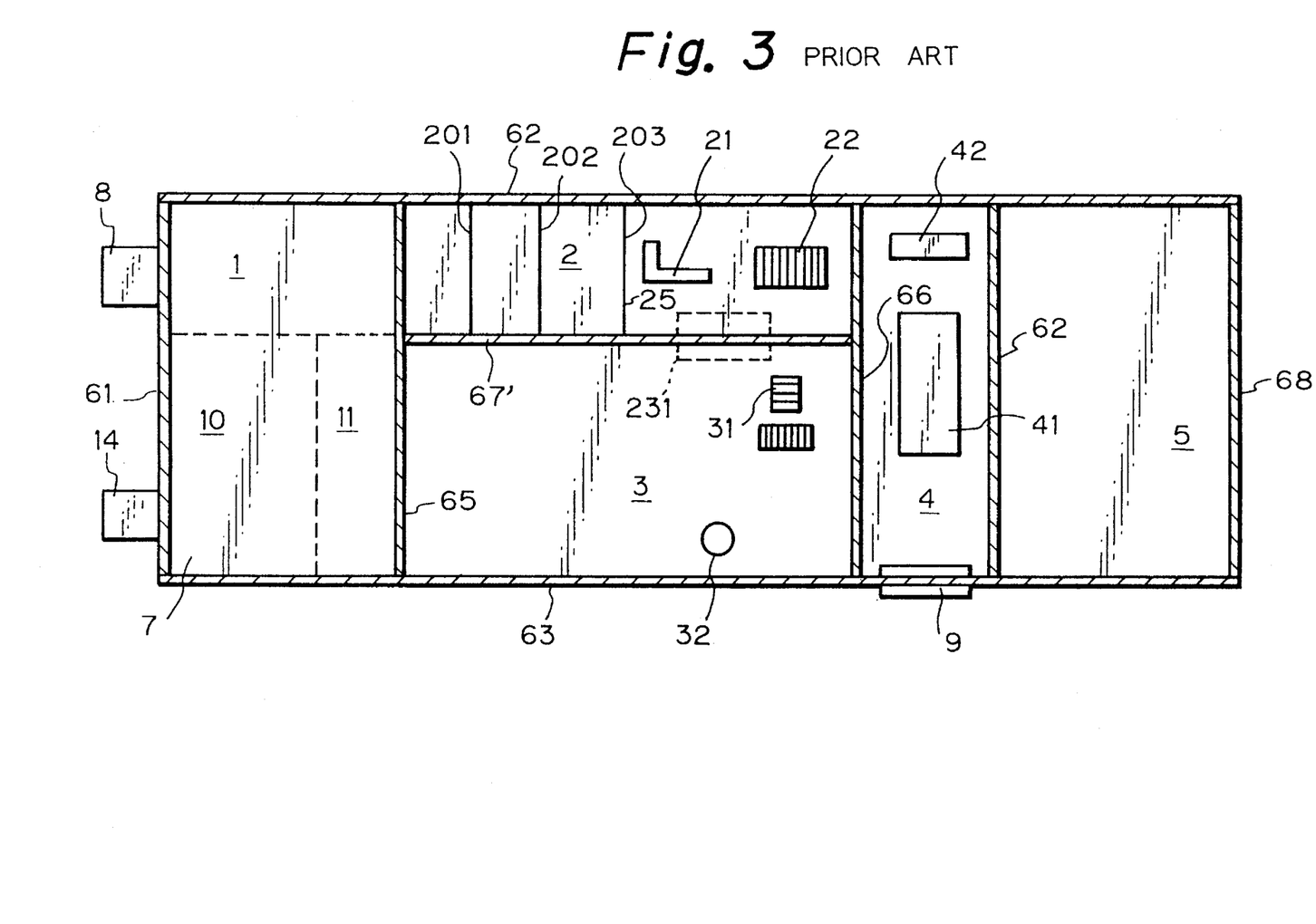

In FIG. 3, which illustrates a third prior art tuner unit which is similar to the tuner unit of FIG. 2, the antenna input filter section 1, the RF modulator section 10 and the switch section 11 are not electromagnetically separated from each other. Also, in the UHF section 2, the local oscillation inductor 21 and the load inductor 22 are not electromagnetically separated from each other. Also, in FIG. 3, an integrated circuit 231 for the mixer/local oscillator of the UHF section 2 and the mixer/local oscillator of the VHF 3 except for the local oscillation inductors 21 and 31 are located on the back of the printed circuit board 7 so as to cross the separating wall 67'.

In the tuner units of FIGS. 1, 2 and 3, the walls 61 through 67 (67') and the wall 68 are fixed to the printed circuit board 7 by soldering or the like, however, it is difficult to fix a center portion of the printed circuit board 7 to the walls, so that the center portion of the printed circuit board 7 may be separated from the walls. As a result, when the tuner units are vibrated, the local oscillation inductor 31 of the VHF section 3 is greatly vibrated, to thereby fluctuate the oscillation frequency of the VHF local oscillator, thus generating noise in a television reception image.

Also, in the VHF section 3 of FIGS. 1, 2 and 3, the local oscillation inductor 31 and the load inductor 32 for the mixer are located within the same section, the output signal of the VHF local oscillator is leaked to a post stage such as the IF section 5 and to the exterior.

Further, particularly, in the UHF section 2 of FIGS. 1, and 2, since the distance between the local oscillator including the local oscillation inductor 21 and the mixer is large enough to increase the stray capacity of the local oscillator, the operation of the local oscillator at a high frequency is unstable at a high temperature.

Still further, in FIGS. 1, 2 and 3, if the local oscillation inductors 21 and 31 is distant from the PLL section 5, interference is caused by spurious signals thus negatively affecting the characteristics of the tuner unit. Therefore, in FIGS. 2 and 3, the PLL circuit 41 is as close as possible to the local oscillators including the local oscillation inductors 21 and 31. In this case, however, a distance between the integrated circuit 41 and the data input portion 9 is so large that digital signals applied to the data input portion 9 affect the operation of the tuner unit and the IF section 5.

Figure 4:
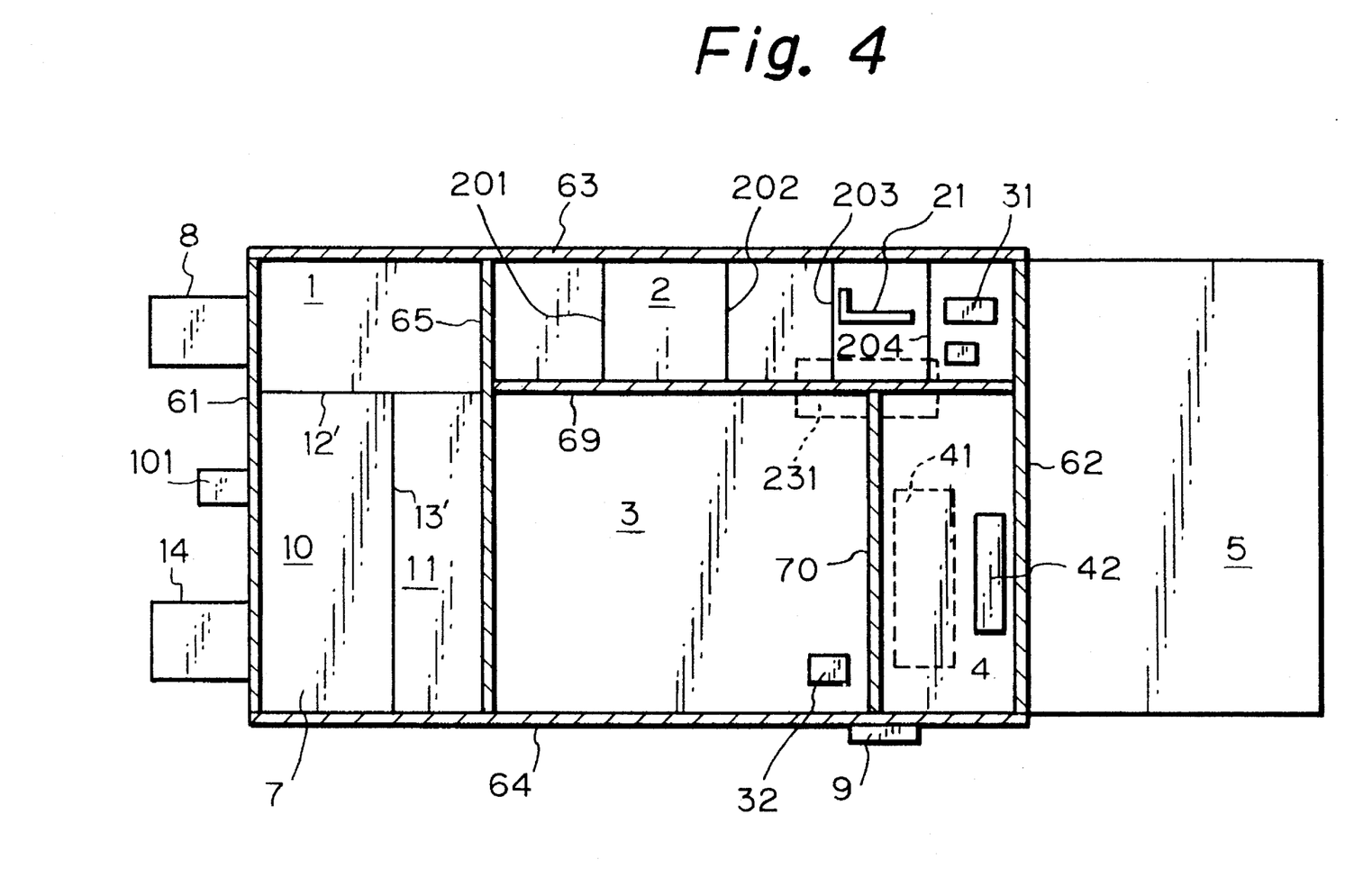
FIG. 4 is a plan view illustrating an embodiment of the tuner unit according to the present invention.

In FIG. 4, which illustrates an embodiment of the present invention, separating walls 69 and 70 are provided instead of the separating walls 67' and 66 of FIG. 2. That is, the separating wall 69 is approximately parallel to the side walls 63 and 64 and is disposed between the end wall 62 and the separating wall 65. Also, the separating wall 70 is approximately parallel to the end wall 62 and the separating wall 65 and is disposed between the side wall 64 and the separating wall 69.

In FIG. 4, the PLL section 4 is defined by the end wall 62, the side wall 64, and the separating walls 69 and 70.

Also, in FIG. 4, the local oscillation inductor 31 is moved from the VHF section 3 to the UHF section 2.

In FIG. 4, the integrated circuit 231 is located on the back of the printed circuit board 7 approximately at an intersection between the separating walls 69 and 70.

Further, in FIG. 4, the antenna input filter section 1, the RF modulator section 10 and the switch section 11 are electromagnetically separated from each other by subdivision walls 12' and 13'. The RF modulator section 10 is connected to a mechanical switch 101 mounted on the end wall 61 between the UHF/VHF common input terminal 8 and the TV signal output terminal 14.

Note that, in FIG. 4, the side walls 63 and 64 are not extended and the end wall 68 of FIG. 2 is not provided, however, the IF section 5 can be electromagnetically isolated in the same way in FIGS. 2 and 3.

Figure 5:
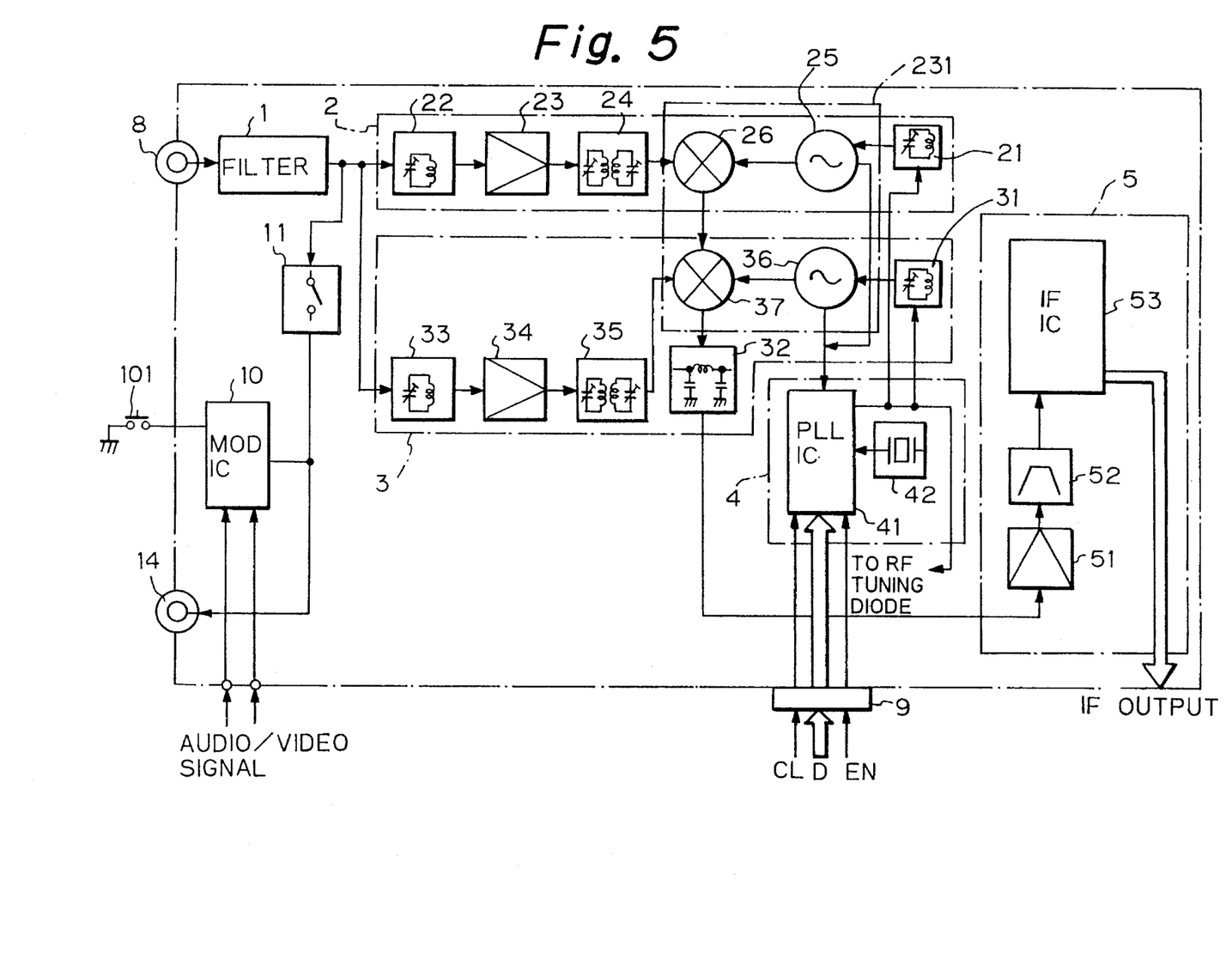
FIG. 5 is a block circuit diagram of an equivalent circuit of the tuner unit of FIG. 4.

Referring to FIG. 5, which is an equivalent circuit diagram of the tuner unit of FIG. 4, the UHF section 2 includes a band pass filter 22, an amplifier 23 and a band pass filter 24 which serve as a preamplifier for a high frequency, a local oscillator 25 associated with the local oscillation inductor 21, and a mixer 26. Similarly, the VHF section 3 includes a band pass filter 33, an amplifier 34 and a band pass filter 35 which serve as a preamplifier for a high frequency, a local oscillator 36 associated with the local oscillation inductor 31, and a mixer 37, in addition to the load inductor 32. Note that the integrated circuit 231 of FIG. 4 incorporates the local oscillators 25 and 36, and the mixers 26 and 37. Also, the IF section 5 includes an amplifier 51, a band pass filter 52, and an IF integrated circuit 53. Further, in the data input portion 9, reference CL designates a clock signal for taking in data D for selecting a channel, and EN designates an enable signal. That is, only when the enable signal EN is high (="1"), is the data D taken into the PLL integrated circuit 41 in synchronization with the clock signal CL.

In FIGS. 4 and 5, since the local oscillation inductors 21 and 31 are located in the areas divided by the subdivision walls, the local oscillation inductors 21 and 31 are resistant to vibration even when the vibration is applied to the tuner unit. Thus, the fluctuations of the local oscillators 25 and 36 are suppressed, so that noise is hardly generated in a television reception image.

Also, since the local oscillation inductor 31 and the load inductor 32 are electromagnetically separated from each other by the separating walls 69 and 70, and the subdivision wall 204, the output signal of the mixer 36 is hardly leaked to the IF section 5 and the like. Therefore, an electromagnetic shield is unnecessary between the local oscillator 36 and the load inductor 32.

Further, the distance between the local oscillator 25 (36) including the local oscillation inductor 21 (31) and the integrated circuit 231 for the mixer 26 (37) can be small. Particularly, a stray capacity affecting the local oscillation signal in the UHF section 2 can be minimized. As a result, even when the ambient temperature is fluctuated, the operation of the local oscillator 25 is stable, thus improving the efficiency of oscillation.

Further, since the integrated circuit 231 for the local oscillators 25 and 36 can be close to the PLL integrated circuit 41 of the PLL section 4, the interference of spurious signals can be avoided. Also, in this case, since the distance between the PLL integrated circuit 41 and the data input portion 9 can be minimized, the digital signals CL, D and EN hardly affect the operation of the tuner unit and the IF section 5.

Further, the mechanical switch 101 is located between the common input terminal 8 and the TV output signal terminal 14. Therefore, when the tuner unit of FIGS. 4 and 5 is mounted on a cabinet of a television set, the mechanical switch 101 as well as the terminals 8 and 14 are exposed outside of the cabinet. Thus, an additional switch is unnecessary to thereby reduce the manufacturing cost.

We claim:

1. A tuner unit having an antenna input filter section, an ultra-high frequency (UHF) section connected to said antenna input filter section, a very-high frequency (VHF) section connected to said antenna input filter section, and a phase-locked loop (PLL) section connected to said UHF section and said VHF section, comprising:

first and second end walls approximately parallel to each other;

first and second side walls approximately parallel to each other and coupled to said first and second end walls;

a first separating wall approximately parallel to said first and second end walls and coupled to said first and second side walls, said antenna input filter section being defined by said first end wall, said first and second side walls and said first separating wall;

a second separating wall approximately parallel to said first and second side walls and coupled to said first separating wall and said second end wall;

a third separating wall approximately parallel to said second end wall and said first separating wall and coupled to said second separating wall and said second side wall, said VHF section excluding an inductor therefor being defined by said first, second and third separating walls and said second side wall, said PLL section being defined by said second end wall, said second and third separating walls and said second side wall; and at least first and second subdivision walls approximately parallel to said first separating wall and said second end wall and coupled to said first side wall and said second separating wall, said UHF section excluding an inductor therefor being defined by said first side wall, said first and second separating walls and said first subdivision wall, said inductor for said UHF local oscillator being disposed in an area defined by said first side wall, said first and second subdivision walls and said second separating wall, said inductor for said VHF local oscillator being disposed in an area defined by said first side wall, said second subdivision wall, said second separating wall and said second end wall.

2. A tuner unit as set forth in claim 1, wherein an integrated circuit of a UHF mixer/local oscillator except for said inductor therefor and of a VHF mixer/local oscillator except for said inductor therefor is disposed on a back face of a printed circuit board having all of said walls mounted on a front face thereof, approximately at an intersection between said second and third separating walls.

3. A tuner unit as set forth in claim 1, further comprising a UHF/VHF common antenna input terminal disposed on said first end wall and connected to said antenna input filter section.

4. A tuner unit as set forth in claim 1, further comprising:

a radio frequency (RF) modulator and a switch disposed in an area defined by said first end wall, said first and second side walls and said first separating wall, said RF modulator being connected via said switch to said antenna input filter section; and a television (TV) signal output terminal disposed on said first end wall and connected to said RF modulator.

5. A tuner unit as set forth in claim 4, further comprising a mechanical switch disposed on said first end wall and connected to said RF modulator.

6. A tuner unit as set forth in claim 1, further comprising a data input portion disposed on said second side wall approximately at an intersection between said second end wall and said third separating wall.

7. A tuner unit as set forth in claim 1, being connected to an intermediate frequency (IF) amplifier disposed on said second end wall.

8. A tuner unit having an antenna input filter section, an ultra-high frequency (UHF) section connected to said antenna input filter section, a very-high frequency (VHF) section connected to said antenna input filter section, and a phase-locked loop (PLL) section connected to said UHF section and said VHF section, comprising:

first and second end walls approximately parallel to each other;

first and second side walls approximately parallel to each other and coupled to said first and second end walls;

a first separating wall approximately parallel to said first and second end walls and coupled to said first and second side walls, said antenna input filter section being defined by said first end wall, said first and second side walls and said first separating wall; and second and third separating walls for providing a first area for said UHF section and an inductor for a VHF local oscillator, a second area for said VHF section excluding said inductor therefor, and a third area for said PLL section, said second separating wall being coupled to said first separating wall and said second end wall, said third separating wall being coupled to said second separating wall and said second side wall, said first area being subdivided by at least two subdivision walls coupled to said first side wall and said second separating wall into a first sub-area for said UHF section excluding an inductor for a UHF local oscillator, a second sub-area for said inductor for said UHF local oscillator, and a third sub-area for said inductor for said VHF local oscillator.

9. A tuner unit as set forth in claim 8, wherein said second separating wall is approximately parallel to said first and second side walls and is disposed between said first separating wall and said second end wall; and wherein said third separating wall is approximately parallel to said second end wall and said first separating wall and is disposed between said second separating wall and said second side wall, said first area being defined by said first side wall, said first and second separating walls and said second end wall, said second area being defined by said first, second and third separating walls and said second side wall, said third area being defined by said second end wall, said second and third separating walls and said second side wall.

10. A tuner unit as set forth in claim 9, wherein an integrated circuit of a UHF mixer/local oscillator except for said inductor therefor and of a VHF mixer/local oscillator except for said inductor therefor is disposed on a back face of a printed circuit board having all of said walls mounted on a front face thereof, approximately at an intersection between said second and third separating walls.

11. A tuner unit as set forth in claim 8, further comprising a UHF/VHF common antenna input terminal disposed on said first end wall and connected to said antenna input filter section.

12. A tuner unit as set forth in claim 8, further comprising:

a radio frequency (RF) modulator and a switch disposed in an area defined by said first end wall, said first and second side walls and said first separating wall, said RF modulator being connected via said switch to said antenna input filter section; and a television (TV) signal output terminal disposed on said first end wall and connected to said RF modulator.

13. A tuner unit as set forth in claim 12, further comprising a mechanical switch disposed on said first end wall and connected to said RF modulator.

14. A tuner unit as set forth in claim 9, further comprising a data input portion disposed on said second side wall approximately at an intersection between said second end wall and said third separating wall.

15. A tuner unit as set forth in claim 8, being connected to an intermediate (IF) amplifier disposed on said second end wall.

16. A tuner unit having an antenna input filter section, an ultra-high frequency (UHF) section connected to said antenna input filter section, a very-high frequency (VHF) section connected to said antenna input filter section, and a control section connected to said UHF section and said VHF local oscillator, comprising:

first and second end walls approximately parallel to each other;

first and second side walls approximately parallel to each other and coupled to said first and second end walls;

a first separating wall approximately parallel to said first and second end walls and coupled to said first and second side walls, said antenna input filter section being defined by said first end wall, said first and second side walls and said first separating wall;

a second separating wall approximately parallel to said first and second side walls and coupled to said first separating wall and said second end wall;

a third separating wall approximately parallel to said second end wall and said first separating wall and coupled to said second separating wall and said second side wall, said VHF section excluding an inductor for a VHF local oscillator being defined by said first, second and third separating walls and said second side wall, said control section being defined by said second end wall, said second and third separating walls and said second side wall; and at least first and second subdivision walls approximately parallel to said first separating wall and said second end wall and coupled to said first side wall and said second separating wall, said UHF section excluding an inductor for a UHF local oscillator being defined by said first side wall, said first and second separating wall and said first subdivision wall, said inductor for said UHF local oscillator being disposed in an area defined by said first side wall, said first and second subdivision walls and said second separating wall, said inductor for said VHF local oscillator being disposed in an area defined by said first side wall, said second subdivision wall, said second separating wall and said second end wall.

17. A tuner unit as set forth in claim 16, wherein an integrated circuit of a UHF mixer/local oscillator except for said inductor therefor and of a VHF mixer/local oscillator except for said inductor therefor is disposed on a back face of a printed circuit board having all of said walls mounted on a front face thereof, approximately at an intersection between said second and third separating walls.

18. A tuner unit as set forth in claim 16, further comprising a UHF/VHF common antenna input terminal disposed on said first end wall and connected to said antenna input filter section.

19. A tuner unit as set forth in claim 16, further comprising:

a radio frequency (RF) modulator and a switch disposed in an area defined by said first end wall, said first and second side walls and said first separating wall, said RF modulator being connected via said switch to said antenna input filter section; and a television (TV) signal output terminal disposed on said first end wall and connected to said RF modulator.

20. A tuner unit as set forth in claim 19, further comprising a mechanical switch disposed on said first end wall and connected to said RF modulator.

21. A tuner unit as set forth in claim 16, further comprising a data input portion disposed on said second side wall approximately at an intersection between said second end wall and said third separating wall.

22. A tuner unit as set forth in claim 16, being connected to an intermediate frequency (IF) amplifier disposed on said second end wall.

* * * * *